(12) United States Patent
Yamamoto et al.

(10) Patent No.: US 11,347,236 B2
(45) Date of Patent: May 31, 2022

(54) MARKER DETECTION METHOD AND VEHICULAR SYSTEM

(71) Applicant: AICHI STEEL CORPORATION, Tokai (JP)

(72) Inventors: Michiharu Yamamoto, Tokai (JP); Tomohiko Nagao, Tokai (JP); Hitoshi Aoyama, Tokai (JP)

(73) Assignee: AICHI STEEL CORPORATION, Tokai (JP)

( * ) Notice: Subject to any disclaimer, the term of this patent is extended or adjusted under 35 U.S.C. 154(b) by 214 days.

(21) Appl. No.: 16/622,317

(22) PCT Filed: Jun. 7, 2018

(86) PCT No.: PCT/JP2018/021791
§ 371 (c)(1),
(2) Date: Dec. 13, 2019

(87) PCT Pub. No.: WO2018/230422
PCT Pub. Date: Dec. 20, 2018

(65) Prior Publication Data
US 2021/0149414 A1 May 20, 2021

(30) Foreign Application Priority Data
Jun. 14, 2017 (JP) .............................. JP2017-116977

(51) Int. Cl.
*G05D 1/02* (2020.01)
*B62D 1/28* (2006.01)
(Continued)

(52) U.S. Cl.
CPC ............. *G05D 1/0261* (2013.01); *B62D 1/28* (2013.01); *G01R 33/02* (2013.01); *G01V 3/165* (2013.01);
(Continued)

(58) Field of Classification Search
None
See application file for complete search history.

(56) References Cited

U.S. PATENT DOCUMENTS 4,714,124 A 12/1987 Laib
5,347,456 A 9/1994 Zhang et al.
(Continued)

FOREIGN PATENT DOCUMENTS

EP 1 020 707 A1 7/2000
JP 08-201006 A 8/1996
(Continued)

OTHER PUBLICATIONS

Extended European Search Report dated Feb. 11, 2021 in European Application No. 18817135.9.
(Continued)

*Primary Examiner* — Hunter B Lonsberry
*Assistant Examiner* — Paysun Wu
(74) *Attorney, Agent, or Firm* — Xsensus LLP

(57) ABSTRACT

In a marker detection method in which a sensor unit (11) that includes a plurality of magnetic sensors arranged in a vehicle width direction is used to detect magnetic markers (10) laid in a road, a feature value that represent symmetry of magnetic distribution, which is the distribution of magnetic measurement values obtained by each magnetic sensor included in the sensor unit (11) is generated, and threshold process regarding the feature value is executed to determine the possibility of the presence of magnetic generation source other than magnetic marker (10), that causes disturbance, and hence to suppress erroneous detection.

20 Claims, 14 Drawing Sheets

(51) Int. Cl.
    *G01R 33/02*     (2006.01)
    *G01V 3/165*     (2006.01)
    *G01V 3/38*     (2006.01)
    *G08G 1/02*     (2006.01)
    *G08G 1/042*     (2006.01)

(52) U.S. Cl.
    CPC ............... *G01V 3/38* (2013.01); *G08G 1/02* (2013.01); *G08G 1/042* (2013.01); *G05D 2201/0213* (2013.01)

(56) References Cited

U.S. PATENT DOCUMENTS

2015/0247719 A1    9/2015   Huang et al.
2021/0150905 A1*   5/2021   Yamamoto ............... B62D 1/28

FOREIGN PATENT DOCUMENTS

| JP | H1123209 A | * | 1/1999 | |
| JP | H1194566 A | * | 4/1999 | |
| JP | 2002-039707 A | | 2/2002 | |
| JP | 2003-288117 A | | 10/2003 | |
| JP | 2005-122256 A | | 5/2005 | |
| JP | 2005-202478 A | | 7/2005 | |
| JP | 2008-077349 A | | 4/2008 | |
| JP | 2014-002094 A | | 1/2014 | |
| WO | 2017/069092 A1 | | 4/2017 | |
| WO | WO-2017069092 A1 | * | 4/2017 | ............ G01R 33/02 |

OTHER PUBLICATIONS

International Search Report and Written Opinion dated Aug. 21, 2018 for PCT/JP2018/021791 filed on Jun. 7, 2018, 9 pages including English Translation of the International Search Report.

* cited by examiner

[FIG.8]

FIG. 11
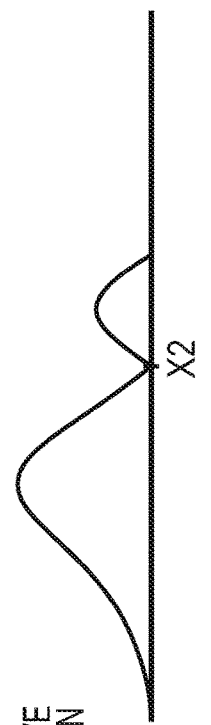
(a) MAGNETIC DISTRIBUTION IN VEHICLE WIDTH DIRECTION
(THE FIRST DISTRIBUTION)
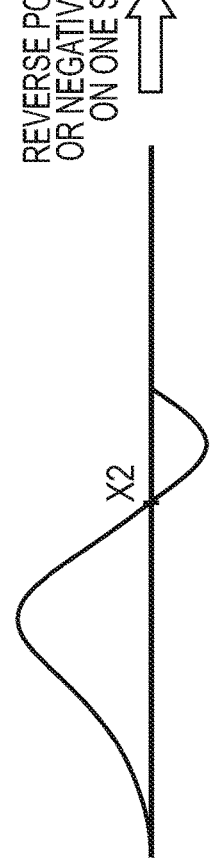
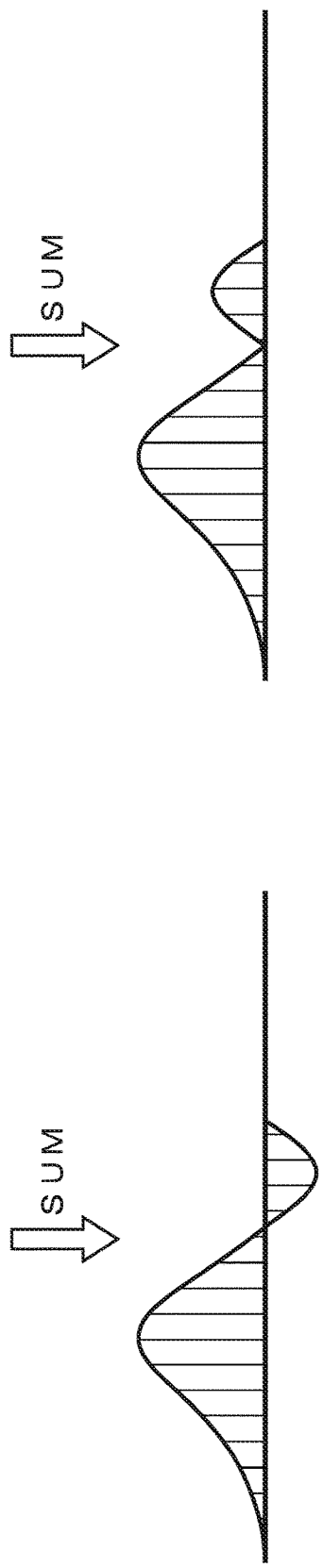
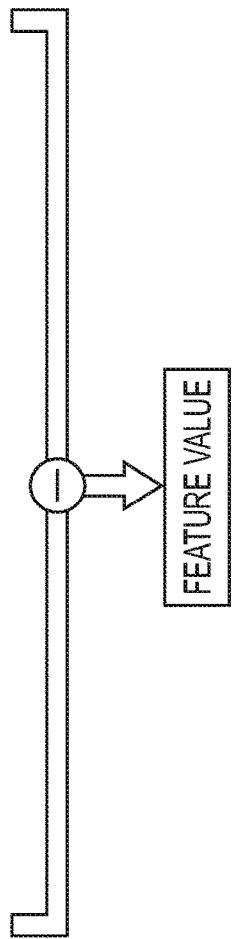
(b) DISTRIBUTION IN WHICH POSITIVE OR NEGATIVE SIGN ON RIGHT SIDE OF ZERO-CROSS IS REVERSED
(THE SECOND DISTRIBUTION)

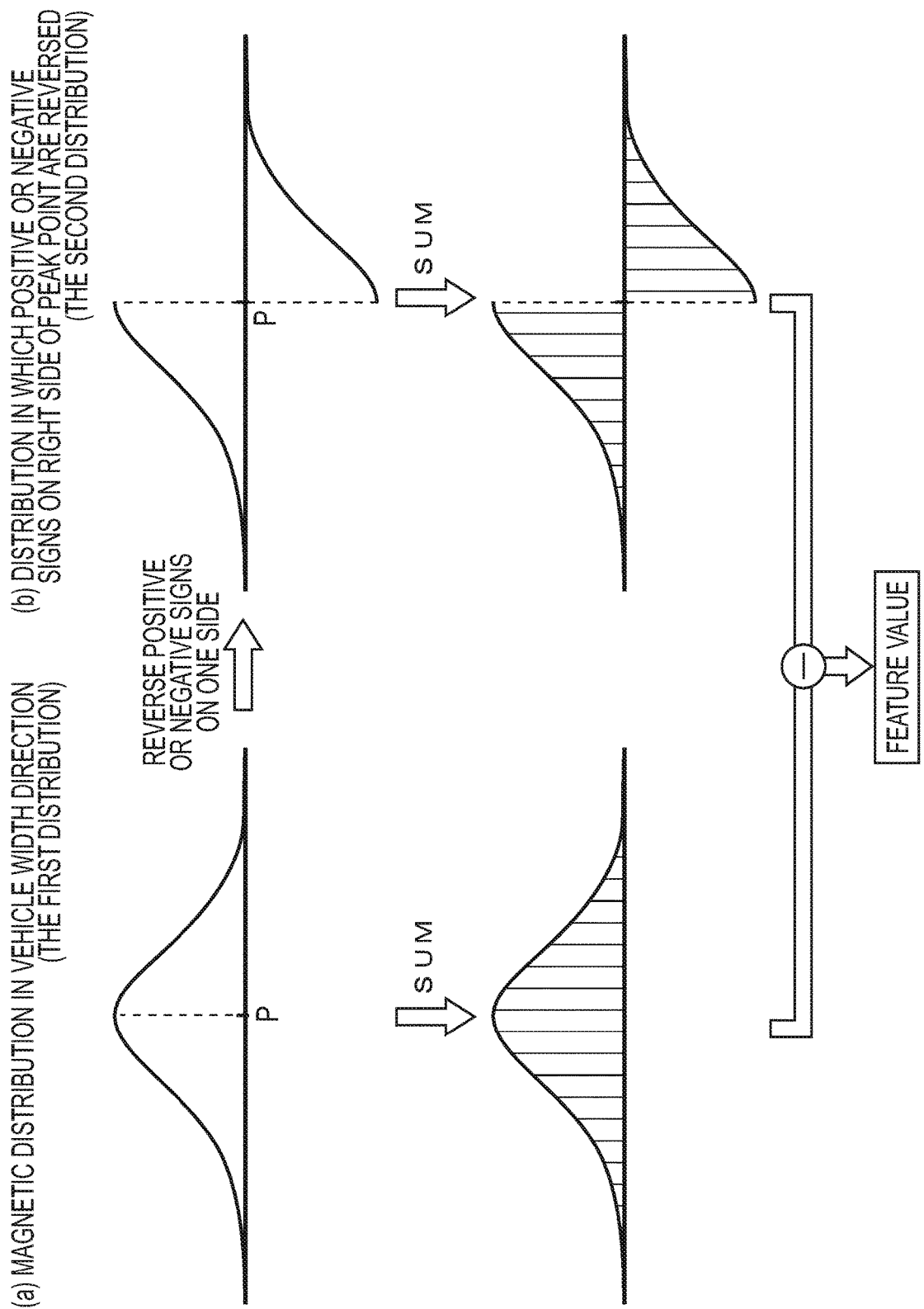

MARKER DETECTION METHOD AND VEHICULAR SYSTEM

CROSS-REFERENCE TO RELATED APPLICATIONS

The present application is based on PCT filing PCT/JP2018/021791, filed Jun. 7, 2018, which claims priority to JP 2017-116977, filed Jun. 14, 2017, the entire contents of each are incorporated herein by reference.

TECHNICAL FIELD

The present invention relates to a marker detection method and a vehicular system for detecting magnetic markers laid in a road.

BACKGROUND ART

Conventionally, a vehicular marker detection system for using the magnetic markers laid in the road for vehicle control is known (see, for example, Patent Literature 1). If such a marker detection system is used to detect, for example, magnetic markers laid along a lane, various driving assist such as automatic steering control, lane departure warning, and automatic driving, and so forth can be achieved.

CITATION LIST

Patent Literature

Patent Literature 1: Japanese Unexamined Patent Application Publication No. 2005-202478

SUMMARY OF INVENTION

Technical Problem

However, the conventional marker detection system described above has the following problems. That is, there is a problem that a reliability of detecting the magnetic markers may be impaired due to various disturbance magnetisms acting on a magnetic sensor or the like. For example, such as iron manholes and other vehicles may become sources of disturbance magnetism.

The present invention has been made in view of the above-described conventional problems, and an object of the present invention is to provide a marker detection method and a vehicular system for suppressing erroneous detection.

Solution to Problem

One aspect of the present invention resides a marker detection method for detecting a magnetic marker laid in a road by using a magnetic sensor mounted to a vehicle, wherein a feature value representing symmetry of a magnetic distribution which is a positional distribution of magnetic measurement values by the magnetic sensor is processed to determine a possibility of a presence of a magnetic generation source other than the magnetic marker, that causes disturbance.

One aspect of the present invention resides in a vehicular system which detects a magnetic marker laid in a road, the system including, a magnetic sensor which detects magnetism of the magnetic marker, and a determination unit which determines a presence or absence of a magnetic generation source that causes disturbance, wherein a possibility of the presence of the magnetic generation source is determined by performing the marker detection method according to any one of the above-mentioned aspects.

Advantageous Effects of Invention

If there is no magnetic generation source that causes disturbance near the magnetic marker, the magnetic distribution approaches symmetry, while if there is the magnetic generation source near the magnetic marker, a magnetic field around the magnetic marker is disturbed, and the symmetry of the magnetic distribution is lost. The marker detection method according to the present invention is a method for determining the possibility of the presence of the magnetic generation source that causes disturbance by focusing on the symmetry of such magnetic distribution.

In the marker detection method according to the present invention, the possibility of the presence of the magnetic generation source that causes disturbance is determined by processing the feature value representing the symmetry of the magnetic distribution. And the vehicular system concerning the present invention determines the possibility of the presence of the magnetic generation source by performing the above-mentioned marker detection method.

According to the present invention, it is possible to reduce erroneous detection of the magnetic marker by determining the possibility of the presence of the magnetic generation source that causes disturbance.

BRIEF DESCRIPTION OF DRAWINGS

FIG. 11 is a descriptive diagram 2 of an arithmetic process for the feature value representing symmetry of magnetic distribution.

FIG. 14 is a descriptive diagram 3 of an arithmetic process for the feature value representing symmetry of magnetic distribution.

DESCRIPTION OF EMBODIMENTS

Figure 1:
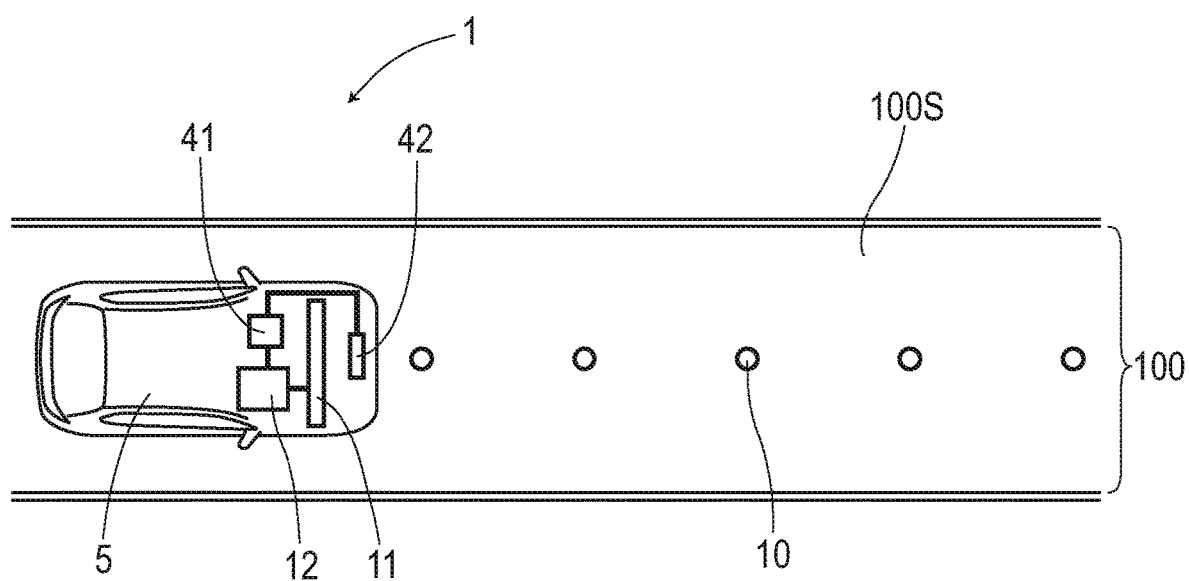
FIG. 1 is a descriptive diagram depicting a vehicular system.

Preferred embodiments in the present invention will be described. In the marker detection method according to the present invention, the magnetic distribution is preferably a distribution in a forwarding direction of the vehicle.

In this case, when the vehicle passes over the magnetic marker, the distribution of temporal changes in magnetism acting on the magnetic sensor can be acquired as the magnetic distribution.

The magnetic distribution is preferably a distribution of the magnetic measurement values by a plurality of magnetic sensors arranged in a vehicle width direction.

In this case, the distribution of the magnetic measurement values measured by the plurality of magnetic sensors at the same timing can be acquired as the magnetic distribution.

It is preferable to determine the presence or absence of the magnetic generation source by a threshold process regarding the feature value.

For example, when it is determined that the magnetic generation source is present, it is preferable to adopt a countermeasure such as suspending the vehicle-side control that uses the magnetic marker.

It is preferable to treat, as the feature value, a magnitude of a differential value between a first total sum indicating a magnitude of a total value of values configuring the magnetic distribution and a second total sum indicating a magnitude of a total value of values belonging to one of both of sides with respect to a center of the magnetic distribution with positive or negative sign reversed and values belonging to another one of both of the sides.

The magnetic distribution is preferably a distribution in which positive or negative sign is reversed at a position straight above the magnetic marker, and a magnitude of a total value of values configuring the magnetic distribution may be treated as the feature value.

In these cases, the feature value can be generated with a relatively simple hardware configuration. For example, if this feature value is generated by arithmetic process, an arithmetic processing load is small, and a small hardware configuration can be adopted.

The feature value is preferably a value normalized by a maximum value of the magnetic distribution.

In this case, an influence by a magnitude of the magnetism acting on the magnetic sensor can be suppressed. If normalization is applied, the possibility of the presence of the magnetic generation source can be determined with high reliability regardless of the magnitude of the magnetism.

It is preferable that the vehicular system according to the present invention includes a control unit which performs control for assisting driving of a vehicle, wherein the control unit switches control contents including whether or not to perform the control for assisting driving in accordance with the possibility of the presence of the magnetic generation source.

If the control contents are switched in accordance with the possibility of the presence of the magnetic generation source, it is possible to avoid the possibility of the control becoming unstable due to the magnetic generation source other than the magnetic marker.

Embodiments

The embodiment of the present invention will be specifically described with reference to the following embodiments.

(First Embodiment)

This embodiment is an example related to a marker detection method and a vehicular system 1 for detecting a magnetic marker 10 laid in a road. The details of this are described with reference to FIG. 1 to FIG. 14.

Figure 2:
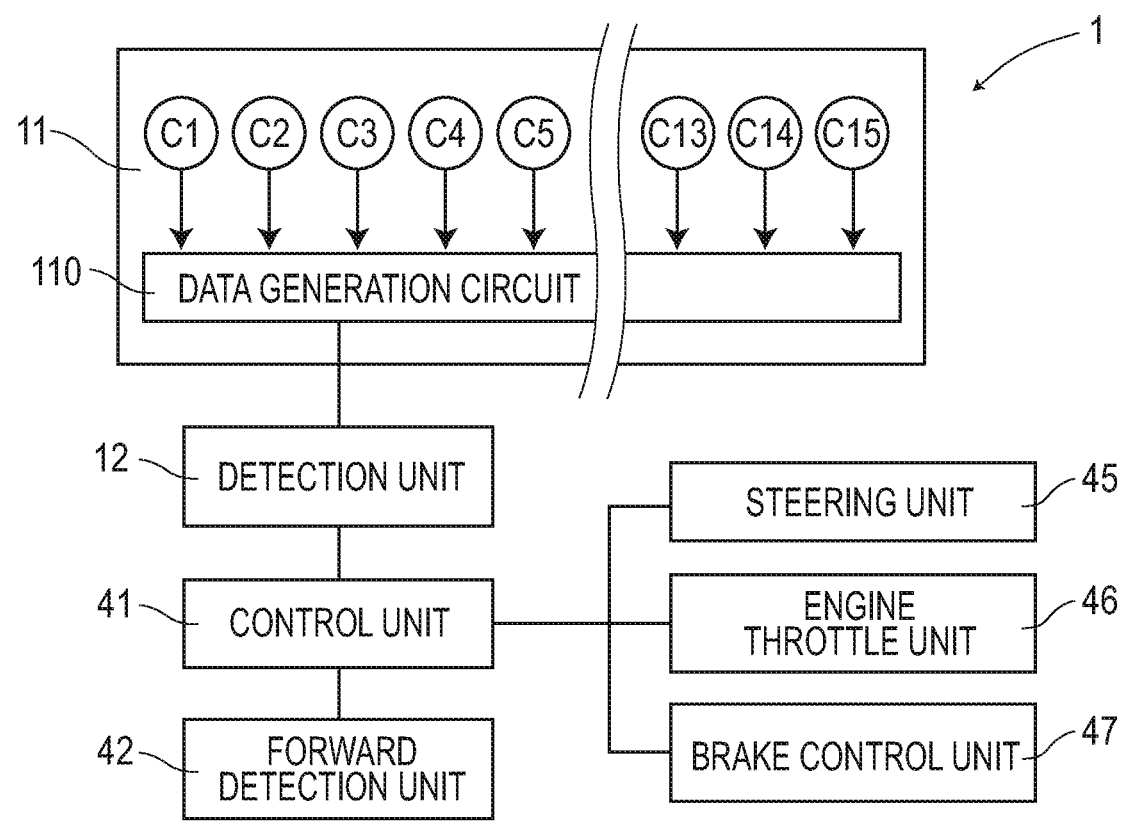
FIG. 2 is a block diagram depicting a configuration of the vehicular system.

As in FIG. 1 and FIG. 2, the marker detection method of this embodiment is a method for detecting the magnetic marker 10 by using a sensor unit 11 on a vehicle 5 side in which a plurality of magnetic sensors Cn (n is an integer from 1 to 15) are arranged in a vehicle width direction. In this marker detection method, a possibility of presence of a magnetic generation source that causes disturbance is determined based on a symmetry of a magnetic distribution generated by the magnetic marker 10.

In a determination process of the possibility of the presence of the magnetic generation source that causes disturbance, the magnetic distribution generated by the magnetic marker 10 is acquired using the sensor unit 11, and a feature value representing the symmetry of this magnetic distribution is generated. Then, the possibility of the presence of the magnetic generation source is determined based on this feature value.

The vehicular system 1 is an example of a driving assist system that causes the vehicle 5 to perform automatic traveling by tracking a lane 100 in which magnetic markers 10 are laid by detecting the magnetic markers 10. The vehicular system 1 is configured to include a detection unit 12 in addition to the sensor unit 11 which includes magnetic sensors Cn. The detection unit 12 is a unit that captures magnetic distribution data from the sensor unit 11 and executes various arithmetic processes. In a marker detection process for detecting the magnetic marker 10, the detection unit 12 executes the determination process for determining the possibility of the presence of the magnetic generation source other than the magnetic marker 10, that causes disturbance.

In addition to the sensor unit 11 and the detection unit 12 described above, the vehicular system 1 is provided with a forward detection unit 42 that measures a distance and so forth from a preceding vehicle, a steering unit 45 that can be controlled externally, an engine throttle unit 46, a brake control unit 47, a control unit 41 for controlling each unit, and so forth.

The steering unit 45 is a unit that controls a steering angle (rudder angle) of a steering wheel of the vehicle 5. The steering unit 45 includes a steering angle sensor, and is capable of measuring and externally outputting the steering angle. The engine throttle unit 46 is a unit that adjusts an engine output by controlling a throttle opening for feeding fuel to the engine. The brake control unit 47 is a unit that adjusts a braking force by controlling a hydraulic pressure or the like of working fluid of a brake system.

In the followings, after overviewing the magnetic marker 10, the forward detection unit 42, the sensor unit 11, the detection unit 12, and the control unit 41 will be described in order.

(Magnetic Marker)

The magnetic marker 10 is a road marker to be laid in the road surface 100S of a road on which the vehicle 5 travels (see FIG. 1). The magnetic markers 10 are arranged at spacings of 3 m, for example, along the center of the lane 100 divided by left and right lane marks.

Figure 3:
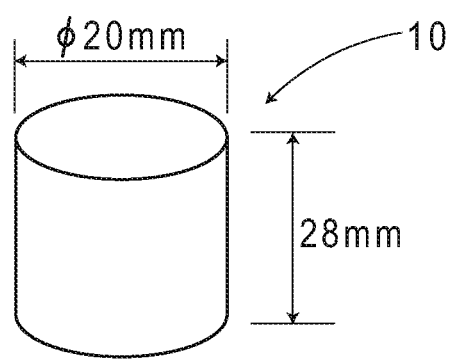
FIG. 3 is a diagram depicting a magnetic marker.

The magnetic marker 10 forms a columnar shape having a diameter of 20 mm and a height of 28 mm, as in FIG. 3 and is laid in a state of being accommodated in a hole provided on the road surface 100S. A magnet forming the magnetic marker 10 is an ferrite plastic magnet formed by dispersing a magnetic powder of iron oxide as a magnetic material in a polymer material as a base material, and has a characteristic of a maximum energy product (BHmax)=6.4 kJ/m$^3$.

Part of specifications of the magnetic marker 10 of the present embodiment is provided in Table 1.

TABLE 1

| Type of magnet | Ferrite plastic magnet |
|---|---|
| Diameter | φ 20 mm |
| Height | 28 mm |
| Magnetic flux density Gs of the surface | 45 mT |

This magnetic marker 10 can act with magnetism having a magnetic flux density of 8 μT (microtesla) at the height of 250 mm, which is an upper limit of a range from 100 to 250 mm, assumed as a mounting height of the sensor unit 11. Note that a magnetic flux density GS of the surface of the magnet forming the magnetic marker 10 is 45 mT (millitesla).

(Forward Detection Unit)

The forward detection unit 42 in FIG. 2 is a unit that measures the distance to an object using a laser beam. Although not depicted in the figure, this forward detection unit 42 is configured to include a laser beam emitting part, a light receiving part for reflected light, and a time measuring part for measuring delay time from emission of the light to reception of the reflected light. The laser beam emitting part includes a polygon mirror (rotating multifaceted mirror) for changing an emission direction of the laser beam.

A range of change of the emission direction by the polygon mirror is in a range of ±15 degrees in a horizontal direction. The forward detection unit 42 is capable of performing one-dimensional line scanning by changing the direction of the laser beam in this range. The forward detection unit 42 measures the above-mentioned delay time for each position in one-dimensional range of ±15 degrees in the horizontal direction, and identifies a distance to an object existing in this range.

The forward detection unit 42 is mounted so that a central axis of the emission direction coincides with the longitudinal direction of the vehicle 5. The forward detection unit 42 in the vehicle-mounted state generates and outputs distance information in which distance data is linked to each position belonging to the one-dimensional range of ±15 degrees in the horizontal direction on the front side of the vehicle 5.

(Sensor Unit)

The sensor unit 11 (FIG. 1 and FIG. 2) is a magnetic detection unit mounted to the bottom face of the vehicle 5. The sensor unit 11 is mounted to an inside of a front bumper, for example. In the case of the vehicle 5 of this embodiment, the mounting height with respect to the road surface 100S is 200 mm.

The sensor unit 11 includes fifteen magnetic sensors Cn arranged at spacings of 10 cm along the vehicle width direction, and a data generation circuit 110 that generates output data (see FIG. 2). The sensor unit 11 is mounted to the vehicle so that central magnetic sensor C8 of fifteen magnetic sensors Cn is positioned at the center of the vehicle 5 in the vehicle width direction.

The data generation circuit 110 is a circuit that generates and externally outputs magnetic distribution data of magnetic measurement values of magnetic sensors Cn in the vehicle width direction. After synchronizing and operating magnetic sensors Cn, the data generation circuit 110 is configured to generate the magnetic distribution data in the vehicle width direction by sequentially reading magnetic measurement value of each magnetic sensor Cn.

The magnetic sensor Cn is an MI sensor that measures magnetism using a known MI effect (Magnet Impedance Effect) that the impedance of a magnetic sensitive body such as an amorphous wire changes sensitively according to an external magnetic field. The magnetic sensor Cn is configured to be capable of detecting the magnitude of magnetic components in two orthogonal directions. In the sensor unit 11, magnetic sensors Cn are incorporated so as to sense magnetic components in the forwarding direction and the vehicle width direction of the vehicle 5. Accordingly, the magnetic distribution data in the vehicle width direction generated by the data generation circuit 110 includes the following two types of magnetic distribution data in the vehicle width direction.

(First Magnetic Distribution Data)

The magnetic distribution data which represents a distribution of magnetic measurement values in the forwarding direction of each magnetic sensor Cn configuring the sensor unit 11.

(Second Magnetic Distribution Data)

The magnetic distribution data which represents a distribution of the magnetic measurement values in the vehicle width direction of magnetic sensors Cn configuring the sensor unit 11.

The magnetic sensor Cn achieves high sensitivity with a magnetic flux density measurement range of ±0.6 mT and a magnetic flux density resolution within the measurement range of 0.02 μT. As described above, the magnetic marker 10 acts on the order of 8 μT of magnetism at the height of 250 mm, which is the upper limit of the range assumed as the mounting height of the sensor unit 11. Use of the magnetic sensor Cn having the magnetic flux density resolution of 0.02 μT allows detection of the magnetism of the magnetic marker 10 with high reliability.

Part of specifications of the magnetic sensor Cn is provided in Table 2.

TABLE 2

| Measurement range | ±0.6 mT |
|---|---|
| Magnetic flux density resolution | 0.02 μT |
| Sampling frequency | 3 kHz |

(Detection Unit)

The detection unit 12 is an arithmetic unit that acquires the magnetic distribution data in the vehicle width direction output from the sensor unit 11 and executes various arithmetic processes. The detection unit 12 is configured to include a CPU (central processing unit) that executes arithmetic process and a memory element such as a ROM (read only memory) or a RAM (random access memory), and so forth.

The detection unit 12 executes various arithmetic processes on the above-mentioned first and the second magnetic distribution data acquired from the sensor unit 11. As the arithmetic process, there is a marker detection process for detecting the magnetic marker 10 and the like.

In the marker detection process, the magnetic marker 10 is detected using the first magnetic distribution data that is the distribution of the magnetic measurement values in the forwarding direction, and a lateral shift amount of the vehicle 5 with reference to the magnetic marker 10 is detected using the second magnetic distribution data that is the distribution of the magnetic measurement values in the vehicle width direction. Furthermore, in the determination process that configures the marker detection process, the presence or absence of the magnetic generation source that causes disturbance is determined using the second magnetic distribution data described above.

The detection unit 12 outputs marker detection information reflecting the results of these processes to the control unit 41.

(Control Unit)

The control unit 41 is a unit that performs lane tracking control for causing the vehicle 5 to travel along the lane 100 in which the magnetic markers 10 are laid. The control unit 41 performs lane tracking control based on acquired information such as distance information from the forward detection unit 42, the steering angle output from the steering unit 45, and marker detection information from the detection unit 12.

The control unit 41 controls the steering unit 45, the engine throttle unit 46, the brake control unit 47, and the like based on the acquired information described above to cause the vehicle 5 to perform automatic traveling by tracking the lane 100 while maintaining an inter-vehicle distance from the preceding vehicle. Note that when the marker detection information includes determination information indicating the presence of the magnetic generation source that causes disturbance, the control unit 41 switches content of the lane tracking control, thereby avoiding erroneous control.

Next, (1) marker detection process for detecting the magnetic marker 10 and (2) lane tracking control for causing the vehicle 5 to perform automatic traveling by tracking the lane 100 will be described. Further, (3) determination process of the presence or absence of the magnetic generation source other than the magnetic marker 10, that causes disturbance and (4) the content of lane tracking control under an action of disturbance when it is determined that there is the magnetic generation source will be described.

(1) Marker Detection Process

The marker detection process is a process executed by the detection unit 12 by acquiring the first and the second magnetic distribution data from the sensor unit 11.

Here, the method of detecting the magnetic marker 10 through marker detection process will be briefly described. As described above, the magnetic sensor Cn is configured to measure magnetic components in the forwarding direction and the vehicle width direction of the vehicle 5. For example, when any of these magnetic sensors Cn moves in the forwarding direction to pass straight above the magnetic marker 10, the magnetic measurement value in the forwarding direction is reversed between positive and negative before and after the magnetic marker 10 as in FIG. 4, and changes so as to cross zero at the position straight above the magnetic marker 10. Therefore, during travelling of the vehicle 5, when zero-cross X1 occurs where the magnetism detected by any of the magnetic sensors Cn in the forwarding direction is reversed between positive and negative, it can be determined that the sensor unit 11 is positioned straight above the magnetic marker 10.

Also, for example, assume a magnetic sensor with the same specifications as the magnetic sensor Cn is moving along a virtual line in the vehicle width direction passing straight above the magnetic marker 10. The magnetic measurement value in the vehicle width direction measured by this magnetic sensor is reversed between positive and negative on both sides across the magnetic marker 10 and changes so as to cross zero at the position straight above the magnetic marker 10. In the case of the sensor unit 11, as in FIG. 5, with fifteen magnetic sensors Cn arranged in the vehicle width direction, the magnetism in the vehicle width direction detected by the magnetic sensor Cn differs in positive or negative, depending on which side the sensor is present with respect to the magnetic marker 10.

Figure 5:
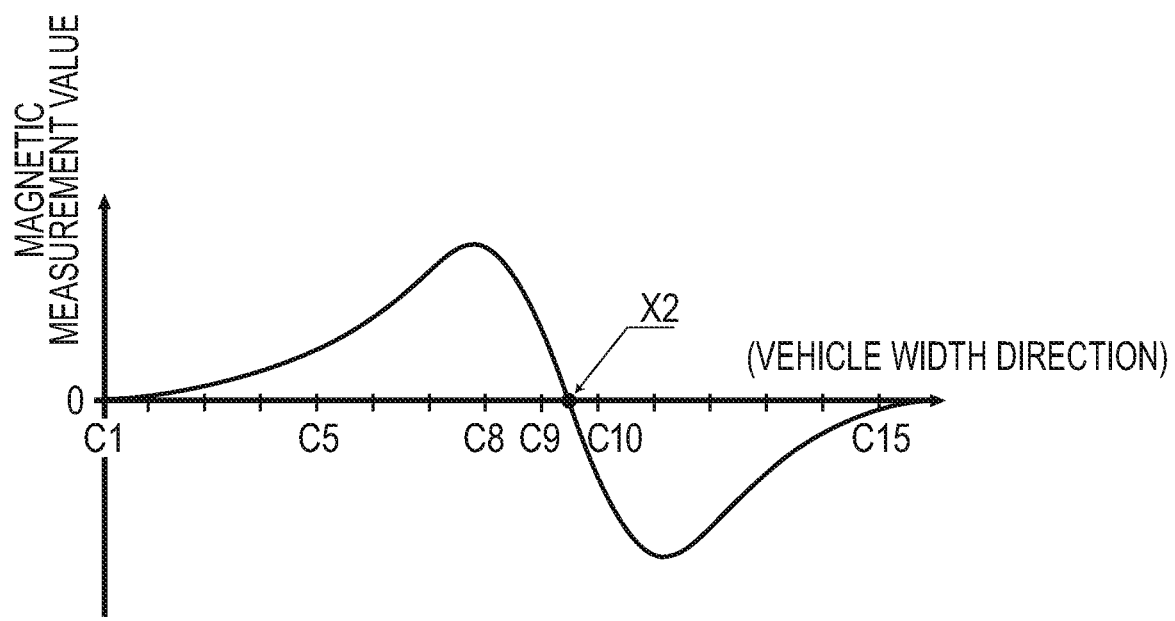
FIG. 5 is a descriptive diagram exemplarily depicting distribution curve of magnetic measurement value in a vehicle width direction by magnetic sensors at the time of passage over the magnetic marker.

That is, the position of zero-cross X2 in the magnetic distribution data in FIG. 5 is the position straight above the magnetic marker 10. For example, as in the case of this figure, the position of the zero-cross X2 at C9.5, which is around the midpoint between the magnetic sensors C9 and C10, is a position straight above the magnetic marker 10 (hereinafter referred to as the position of the magnetic marker 10). Here, in the sensor unit 11 as described above, a space between the adjacent magnetic sensors Cn is 10 cm, and the magnetic sensor C8 is the center of the vehicle 5 in the vehicle width direction. Therefore, in the case of FIG. 5, the position of the magnetic marker 10 is a position shifted by (9.5-8)×10 cm=15 cm to the right side with reference to the center of the vehicle 5 in the vehicle width direction.

Note that, for example, when the vehicle 5 travels closer to the left side in the vehicle width direction, the magnetic marker 10 is shifted to the right side with respect to the sensor unit 11, and the position of the zero-cross X2 is on the right side of the magnetic sensor C8 and of a positive value as exemplarily depicted in FIG. 5. When treating the lateral shift amount to be on a positive side when the vehicle 5 travels closer to the right side and on a negative side when the vehicle 5 travels closer to the left side, in the case of FIG. 5 for example, (−15) cm obtained by reversing the sign in the above described (9.5−8)×10 cm=15 cm, which is the position of the magnetic marker 10, is the lateral shift amount of the vehicle 5.

Next, the flow of marker detection process will be described with reference to FIG. 6.

Figure 4:
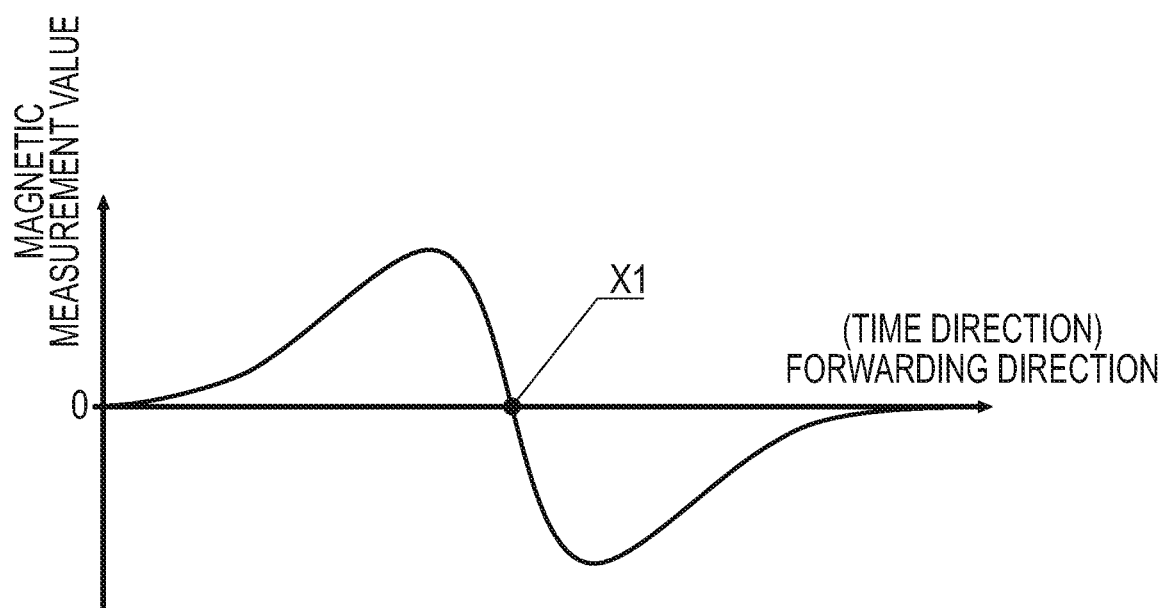
FIG. 4 is a descriptive diagram exemplarily depicting a temporal change of a magnetic measurement value in a forwarding direction at the time of passage over a magnetic marker.

The detection unit 12 acquires the magnetic measurement values in the forwarding direction of the magnetic sensors Cn configuring the first magnetic distribution data (S101) above described. Then, detection of the zero-cross corresponding to X1 in FIG. 4 is attempted regarding a temporal change of the magnetic measurement value in the forwarding direction of at least one of the magnetic sensors Cn (S102). The detection unit 12 repeatedly acquires the magnetic measurement values in the forwarding direction of the magnetic sensors Cn (S101) until this zero-cross is detected (S102: NO).

When the detection unit 12 detects the zero-cross corresponding to X1 in FIG. 4 with respect to the temporal change of the magnetic measurement value in the forwarding direction (S102: YES), the detection unit 12 determines that the sensor unit 11 is positioned straight above the magnetic marker 10. Note that, regarding determination of the detection of the magnetic marker 10, in addition to the detection of the zero-cross corresponding to X1 in FIG. 4, a condition is set in which the rate of temporal change of the magnetic measurement value in the forwarding direction, that is, a magnitude of derivative value (differential value) of the magnetic measurement value should be equal to or larger than a predetermined threshold value.

When the detection unit 12 detects the magnetic marker 10 in response to the detection of the zero-cross corresponding to X1 in FIG. 4, the detection unit 12 acquires the second magnetic distribution data described above representing the distribution of the magnetic measurement values in the vehicle width direction measured at the same timing by magnetic sensors Cn (s103).

While the detection unit 12 executes a process of detecting the lateral shift amount of the vehicle 5 with reference to the magnetic marker 10 (S104-S105), the detection unit 12 executes a determination process P1 for determining the possibility of the presence of the magnetic generation source that causes disturbance. Note that the content of this determination process P1 will be described later in detail.

The detection unit 12 identifies the position of the zero-cross in the vehicle width direction corresponding to X2 in FIG. 5 with respect to the above-mentioned second magnetic distribution data which is the distribution of the magnetic measurement values in the vehicle width direction of the magnetic sensors Cn (S104). Then, based on this position of the zero-cross in the vehicle width direction, the lateral shift amount of the vehicle 5 in the vehicle width direction with reference to the magnetic marker 10 is identified (S105). Specifically, the detection unit 12 reverses positive and negative of the value indicating the position in the vehicle width direction of the zero-cross corresponding to X2 in FIG. 5 to obtain the lateral shift amount in the vehicle width direction.

(2) Normal Lane Tracking Control

Figure 7:
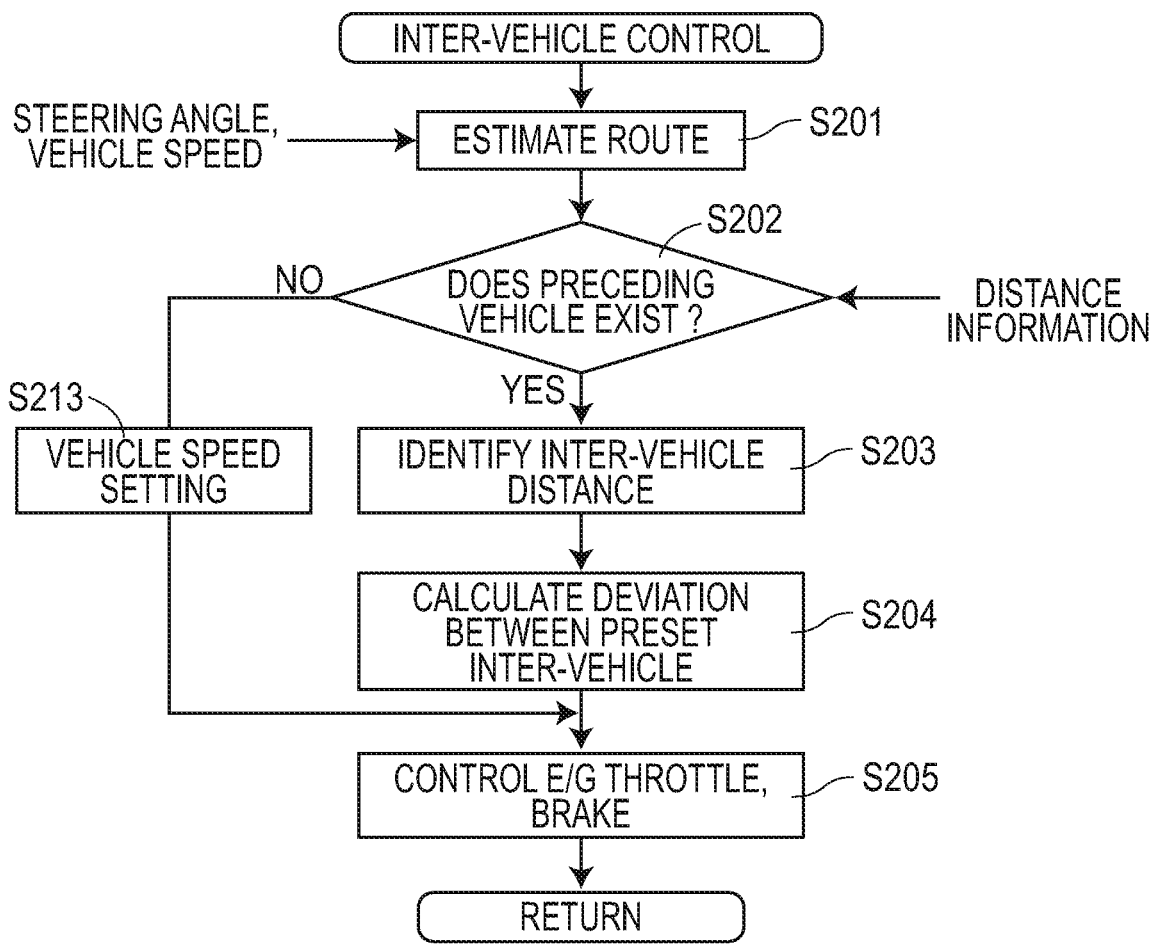
FIG. 7 is a flow diagram depicting a flow of an inter-vehicle control.
Figure 8:
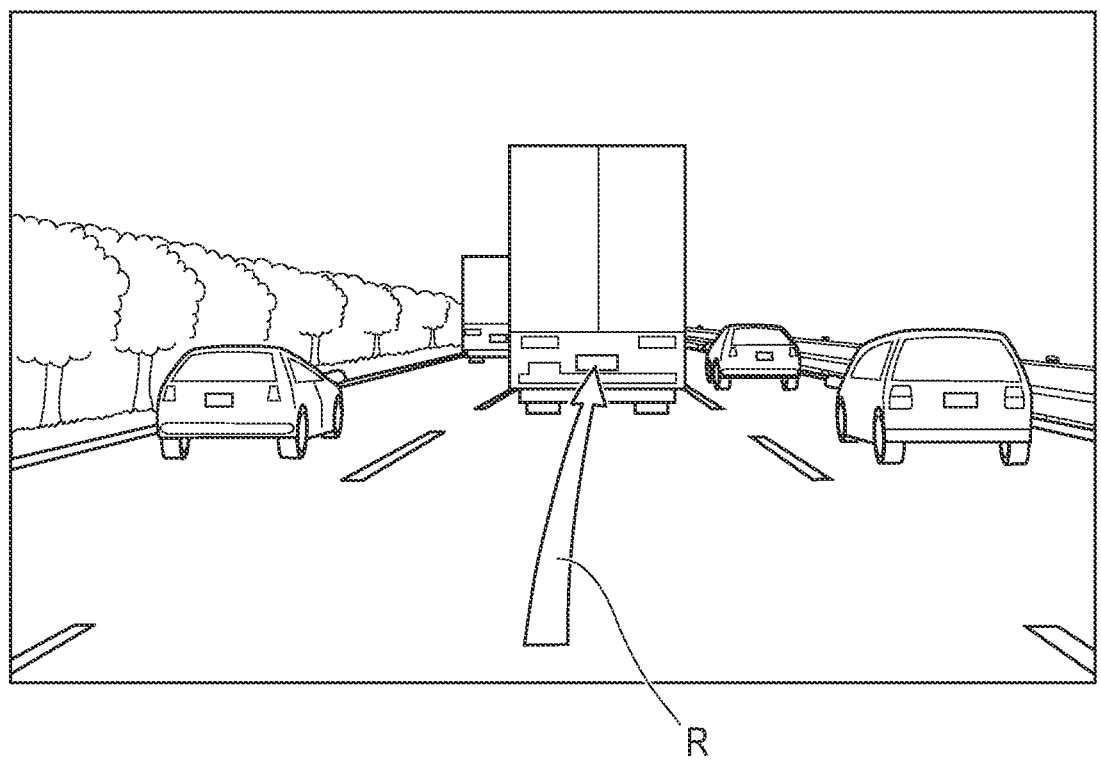
FIG. 8 is a descriptive diagram of an example of selecting a preceding vehicle.
Figure 9:
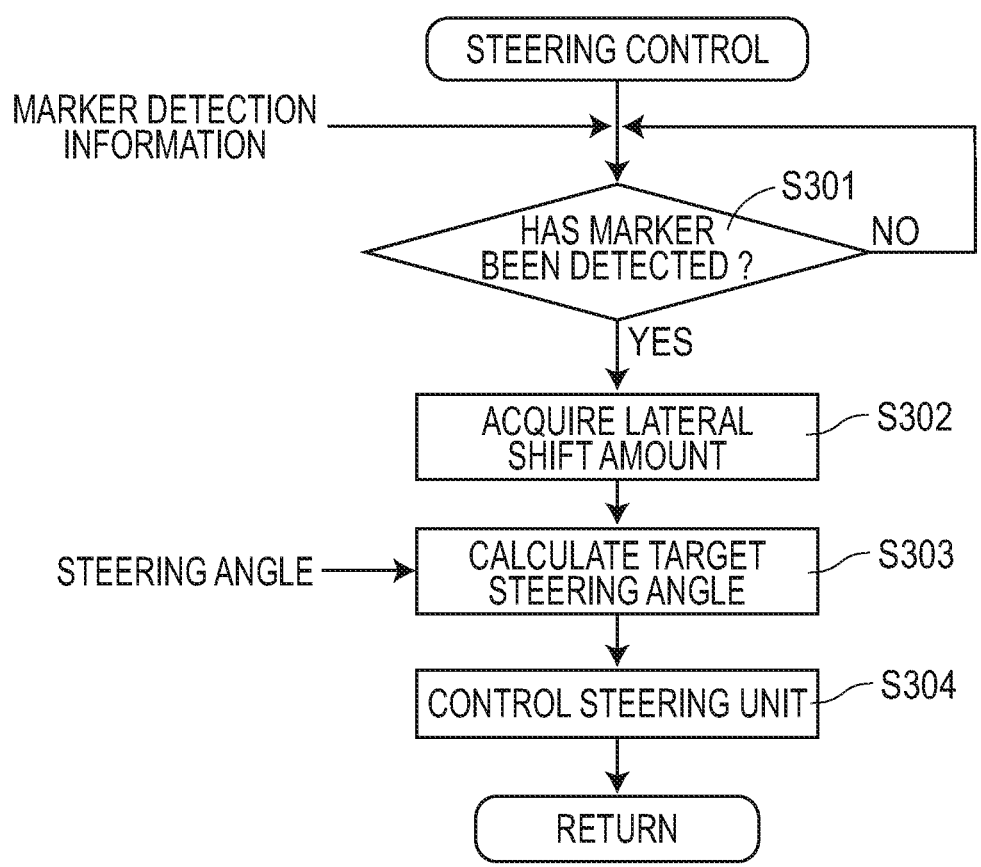
FIG. 9 is a flow diagram depicting a flow of a steering control.

In the lane tracking control, an inter-vehicle control in FIG. 7 and a steering control in FIG. 9 are performed in parallel.

As in FIG. 7, the control unit 41 that performs the inter-vehicle control acquires vehicle information such as the steering angle from the steering unit 45 and a vehicle speed, and executes a calculation for estimating a predicted route R (FIG. 8) of the vehicle 5. (S201).

The control unit 41 acquires distance information from the forward detection unit 42 and determines whether or not an object exists on the route R (S202). If the object exists on the route R as in FIG. 8 (S202: YES), this object is selected as the preceding vehicle to track. Then, the control unit 41 reads distance data linked with this preceding vehicle from the distance information described above and identifies the distance data as the inter-vehicle distance (S203). Note that when selecting the preceding vehicle, it is preferable to determine whether the object is a stationary object or a moving object based on the temporal change of the distance to the object, and to select the preceding vehicle on an assumption that the object is a moving object.

The control unit 41 compares the inter-vehicle distance between the preceding vehicle with a preset target inter-vehicle distance (S204). Then, the control unit 41 controls the engine throttle unit 46, the brake control unit 47, and so forth so that the deviation of the actual inter-vehicle distance with respect to the target inter-vehicle distance becomes closer to zero and adjusts the engine output and/or braking force (S205).

On the other hand, when there is no vehicle ahead in the vehicle's own lane and there is no preceding vehicle (S202: NO), a preset target vehicle speed is set (S213). The control unit 41 controls the engine throttle unit 46 and so forth so as to achieve the target vehicle speed and adjusts the engine output and so forth (S205).

Next, as in FIG. 9, the control unit 41 that performs the steering control determines whether or not the magnetic marker 10 has been detected with reference to the marker detection information acquired from the detection unit 12 (S301). When the magnetic marker 10 is detected (S301: YES), the control unit 41 acquires the lateral shift amount included in the marker detection information (S302).

Based on the steering angle output from the steering unit 45 and the lateral shift amount included in the marker detection information, the control unit 41 calculates a target steering angle for making the lateral shift amount closer to zero (S303). Then, the control unit 41 controls the steering unit 45 so that the steering angle of the steering wheel coincides with the target steering angle (S304), thereby achieving automatic traveling of the vehicle 5 by tracking the lane in which the magnetic markers 10 are laid.

(3) Determination Process

Figure 6:
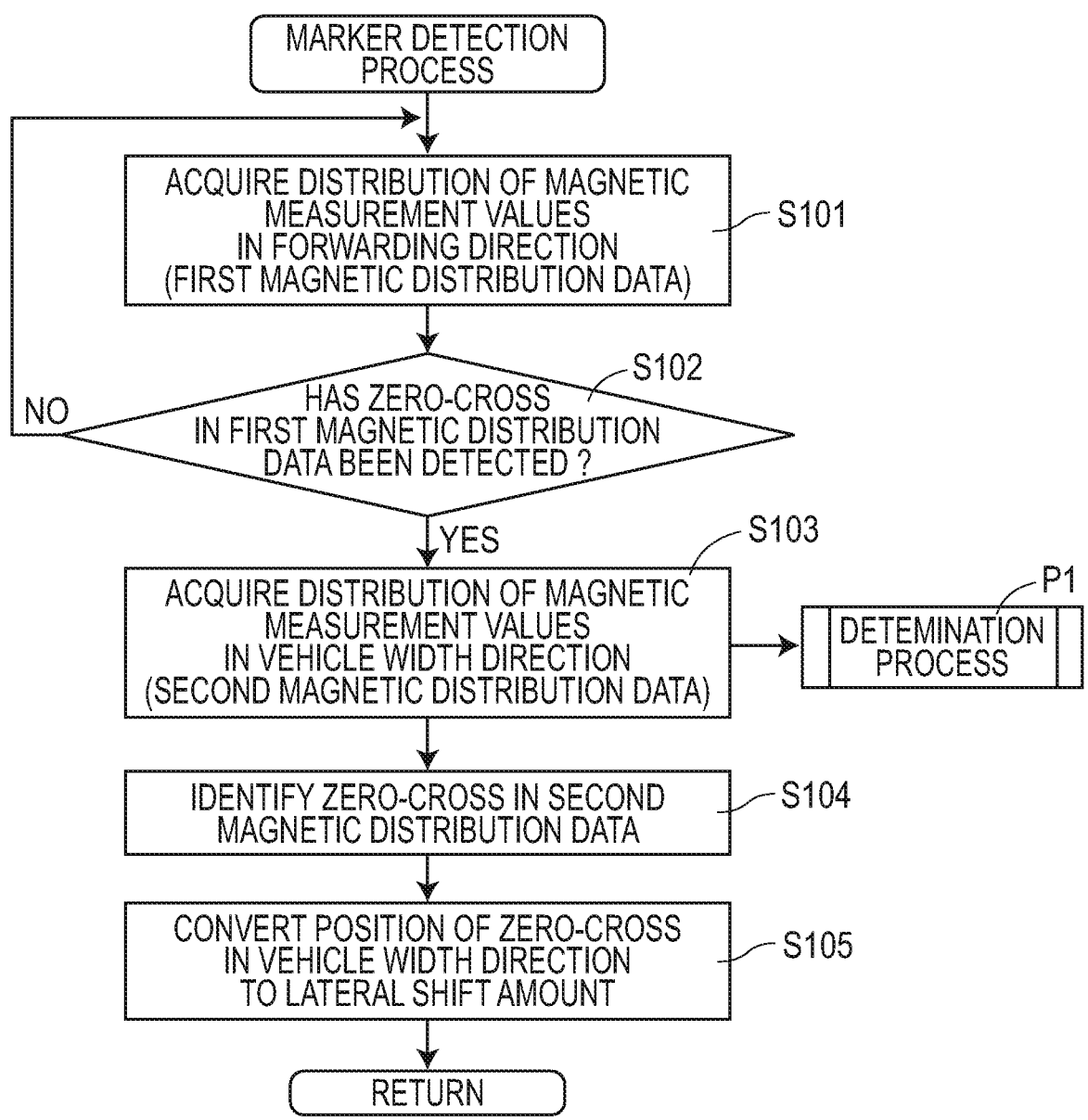
FIG. 6 is a flow diagram depicting a flow of a marker detection process.

The determination process P1 in FIG. 6 is a process executed by the detection unit 12 (an example of a determination unit) for determining the possibility of the presence of the magnetic generation source other than the magnetic marker 10, that causes disturbance. In this determination process P1, the feature value representing the symmetry of the magnetic distribution is generated with respect to the above-described second magnetic distribution data which is the distribution of the magnetic measurement values in the vehicle width direction of the magnetic sensor Cn, and the possibility of the presence of the magnetic generation source that causes disturbance is determined.

In the followings, calculation method of the feature value will be described with reference to FIG. 10 and FIG. 11, and the flow of determination process will be described with reference to a flow diagram of FIG. 12. Note that the determination process of this embodiment is an example of the process for determining the presence or absence of the magnetic generation source as the possibility of the presence of the magnetic generation source that causes disturbance.

First, a calculation method of the feature value will be described with reference to FIG. 10. In this figure, when positive and negative signs of each value on the right side of the zero-cross X2 of the magnetic distribution (first distribution) in the vehicle width direction are reversed, a second distribution is obtained as depicted in (b) of the figure. In the calculation of the feature value, (a) a first total sum that is a magnitude (absolute value) of the total value of each value of the magnetic distribution in the vehicle width direction (first distribution), and (b) a second total sum that is the magnitude (absolute value) of the total value of each value of the second distribution is calculated.

In (a) the first total sum regarding the magnetic distribution (first distribution) in the vehicle width direction, the positive values on the left side are canceled by the negative values on the right side with reference to the zero-cross X2, so the first total sum becomes close to zero. The first total sum becomes close to zero as peaks on both sides of the zero-cross X2 becomes close to point-symmetric, and the first total sum becomes zero if the ideal point symmetry is formed with reference to the zero-cross X2. On the other hand, in (b) the second distribution in which the positive and negative signs of each value on the right side of the zero-cross X2 are reversed, waveforms on both the left and the right sides are of positive values, and thus the second total sum that is an absolute value of the sum of each value increases.

The feature value is the magnitude (absolute value) of the differential value between (a) the first total sum for the magnetic distribution in the vehicle width direction and (b) the second total sum for the second distribution. As described above, the higher the symmetry of the magnetic distribution is, the close to zero (a) the first total sum of the magnetic distribution in the vehicle width direction becomes, and the above-described feature value increases.

Therefore, it can be determined that as the feature value increases, the symmetry of the magnetic distribution becomes high.

On the other hand, when size of the waveforms on both sides of the zero-cross X2 are different as in FIG. 11, the positive and negative signs on both sides of the zero-cross X2 are not sufficiently canceled regarding the magnetic distribution in the vehicle width direction (first distribution). Thus, the first total sum will not be sufficiently reduced. If so, the above-described feature value which is the absolute value of the difference of this first total sum and the second total sum will become small. Therefore, it can be determined that as this feature value becomes small, the symmetry of the magnetic distribution becomes low.

Figure 12:
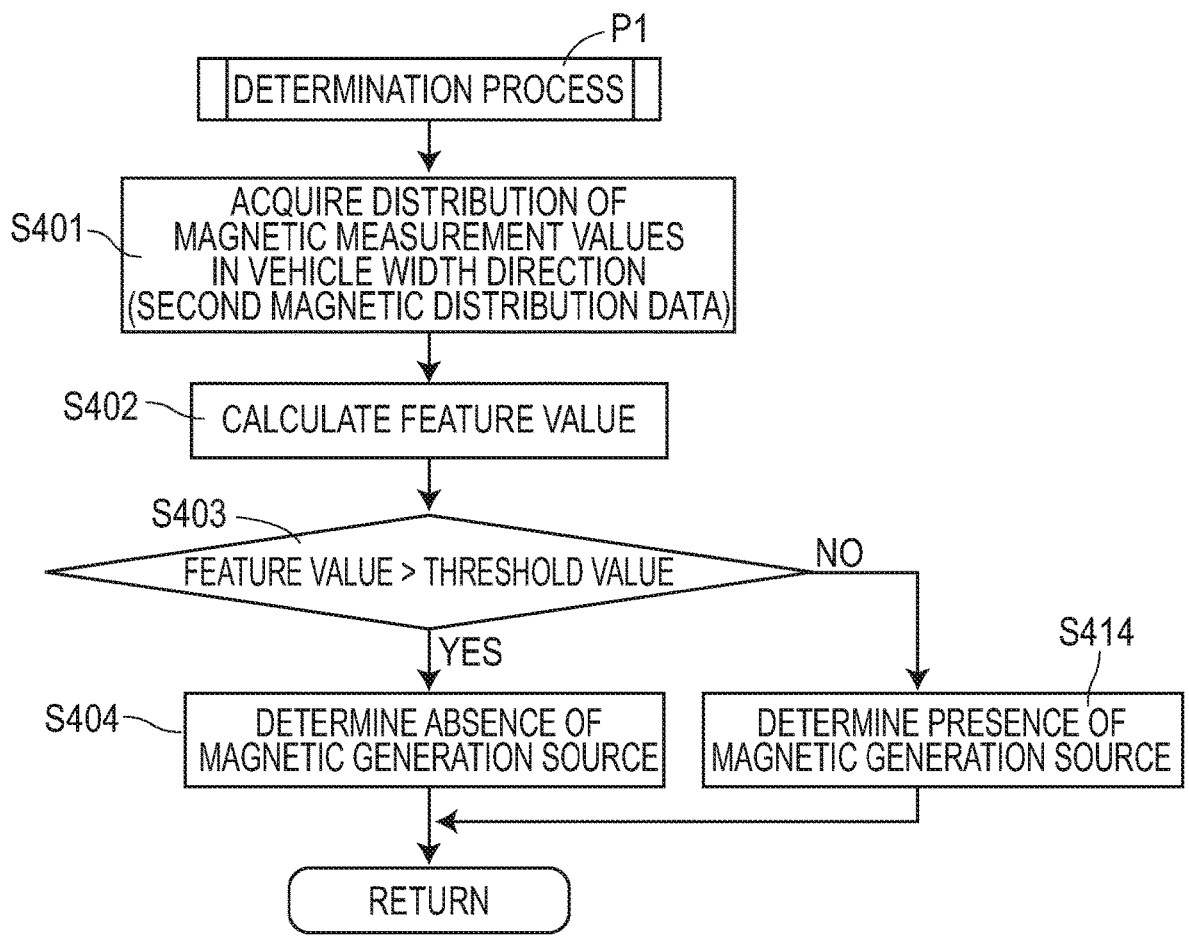
FIG. 12 is a flow diagram depicting a flow of a determination process.

In executing the determination process of FIG. 12, the detection unit 12 first acquires the second magnetic distribution data, which is the distribution of the magnetic measurement values in the vehicle width direction (S401), and calculates the above-mentioned feature value which represents the symmetry of the magnetic distribution (S402). Then, the detection unit 12 executes threshold process regarding this feature value (S403).

When the feature value is a value larger than a preset threshold value (S403: YES), the detection unit 12 determines that the magnetic distribution formed by the magnetic marker 10 has high symmetry, and that there is no magnetic generation source other than the magnetic marker 10, that causes disturbance (S404). On the other hand, when the feature value is equal to or less than the preset threshold value (S403: NO), the detection unit 12 determines that there is the magnetic generation source that causes disturbance and thus the symmetry of the magnetic distribution is impaired (S414).

(4) Lane Tracking Control Under the Action of Disturbance

When the control unit 41 captures from the detection unit 12 marker detection information including a determination result indicating that there is the magnetic generation source that causes disturbance, the control unit 41 switches the content of the lane tracking control from normal control to control under the action of disturbance.

The difference between control under the action of disturbance and normal control is in a setting of a control gain when calculating the target steering angle based on a measured value of the steering angle and the lateral shift amount with reference to the magnetic marker 10. In the control under the action of disturbance, the control gain is changed to compared with the normal control. Thereby, even in the case in which a magnetic field around the magnetic marker 10 is disturbed due to the magnetic generation source that causes disturbance, an influence degree with respect to control of the vehicle 5 is suppressed.

Note that the steering control may be stopped when it is determined that there is the magnetic generation source that causes disturbance. In this case, it is preferable to have a driver to perform the steering operation by displaying a display indicating that the lane tracking control is temporarily suspended, for example, on such as the display panel of the driver's seat. Note that the inter-vehicle control may be continued as it is based on the measured value of the steering angle and the distance information by the forward detection unit 42.

As described above, the marker detection method of the present embodiment is a method for determining the possibility of the presence of the magnetic generation source that causes disturbance by focusing on the symmetry of the magnetic distribution. If there is no magnetic generation source other than the magnetic marker 10, the symmetry of the magnetic distribution is retained high. On the other hand, if there is the magnetic generation source other than the magnetic marker 10, that causes disturbance, there is high possibility that the magnetic distribution is disturbed and the symmetry of the magnetic distribution is impaired. By focusing on the symmetry of the magnetic distribution in the vehicle width direction as described above, it is possible to determine with high reliability whether or not there is the magnetic generation source that causes disturbance.

In addition, the vehicular system 1 that performs the marker detection method described above switches control for the vehicle 5 to perform automatic traveling by tracking the lane according to the presence or absence of the magnetic generation source that causes disturbance. When it is determined that there is the magnetic generation source that causes disturbance, the control gain is decreased to slow a reaction on the vehicle 5 side, thereby suppressing the disturbance of behavior caused by the magnetic generation source that causes disturbance.

In this embodiment, the possibility of the presence of the magnetic generation source that causes disturbance is determined by focusing on the symmetry of the magnetic distribution in the vehicle width direction. Instead of or in addition to this, it is also preferable to determine the possibility of the presence of the magnetic generation source that causes disturbance by focusing on the symmetry of the forwarding direction. In this case, a sensor unit in which a plurality of magnetic sensors is arranged in the vehicle width direction is not imperative. The magnetic distribution in the forwarding direction can be acquired with only one magnetic sensor.

In this embodiment, as the possibility of the presence of the magnetic generation source that causes disturbance, the presence or absence of the magnetic generation source that causes disturbance is determined, however, instead of this, it is also preferable to represent the possibility stochastically, such as 100%, 60%, and 20%. Alternatively, the possibility of the presence may be represented by a degree or the like such as level 2, level 5 and level 9, with level 10 as an upper limit. In this way, the possibility of the presence may be determined by a process in which the above-mentioned feature value is replaced with a stochastic numerical value or a degree.

For lane tracking control when the possibility of the presence of the magnetic generation source is represented by the stochastic numerical value or a degree, the control gain may be changed stepwise depending on the degree or the like. Alternatively, by threshold process on the degree or the like, lane tracking control may be performed when the degree is equal to or less than the threshold value, while lane tracking control may be suspended when the degree exceeds the threshold value.

Figure 10:
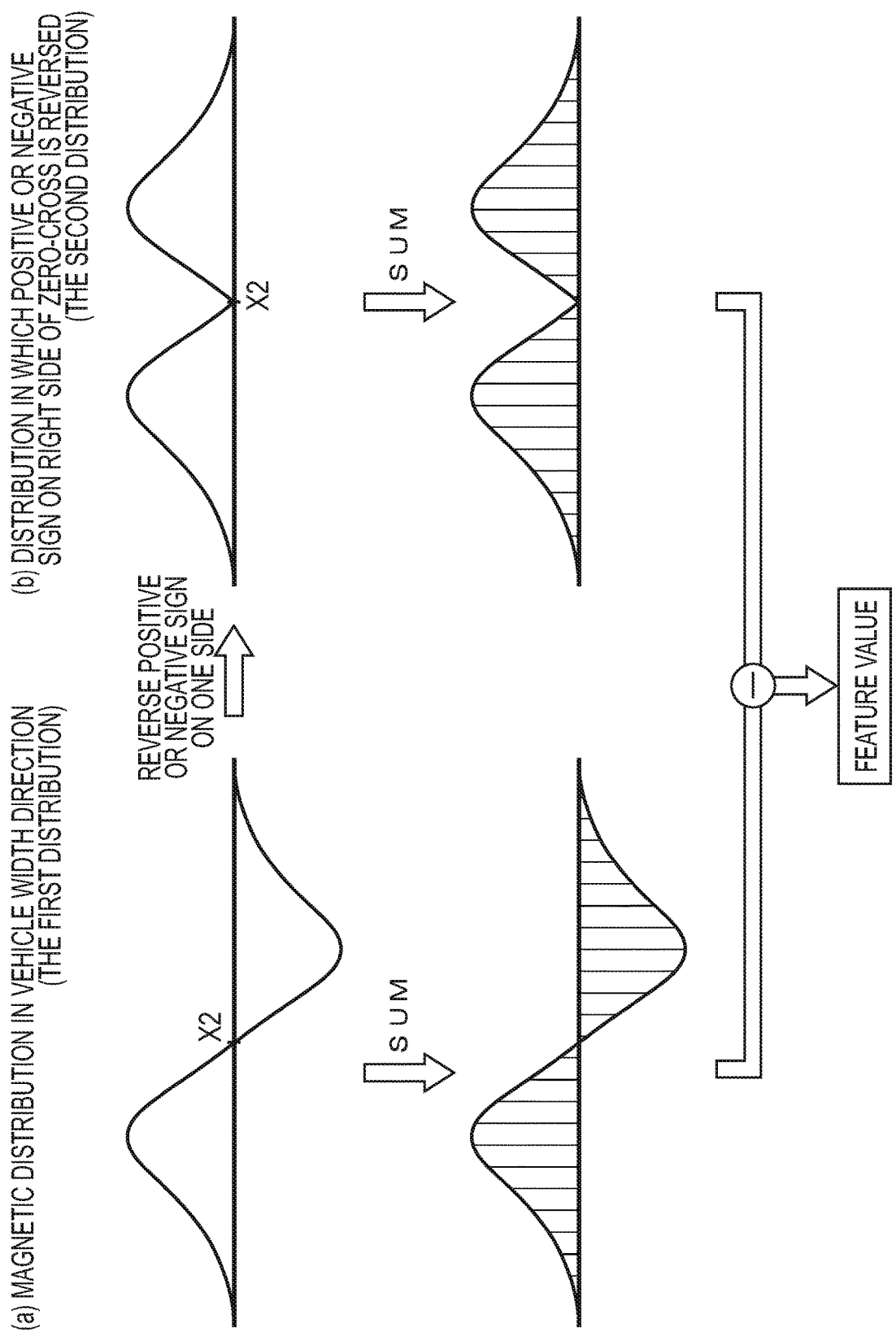
FIG. 10 is a descriptive diagram 1 of an arithmetic process for a feature value representing symmetry of magnetic distribution.

For example, when the vehicle 5 passes through an uniform magnetic field derived from a bridge having a reinforcement structure or the like, the magnetism acting on the sensor unit 11 approaches uniformly, and the symmetry (line symmetry) of the magnetic distribution becomes high, and there is a possibility that the feature value to be calculated as in FIG. 10 takes a relatively large value. On the other hand, in the marker detection process of this embodiment, as in S102 in FIG. 6, the determination process P1 is executed when the zero-cross occurs in the magnetic distribution in the forwarding direction and the magnetic marker 10 is detected. Therefore, the feature value taking a large value in the uniform magnetic field as described above is not likely to become apparent as a technical problem.

For example, the feature value may be calculated on a magnetic distribution of magnetic gradients such as temporal differences (differentiations) or positional differences (differentiations) of magnetic measurement values obtained by the magnetic sensor. In the uniform magnetic field as described above, the magnetic gradients become close to zero. Therefore, if the magnetic distribution of magnetic gradients is taken as a target, a small feature value can be obtained in the uniform magnetic field as described above.

In this embodiment, in calculating the second total sum (FIG. 10 and FIG. 11) in order to calculate the feature value, the zero-cross X2 is treated as the center of the magnetic distribution, and the positive or negative sign of the value on one side is reversed to obtain (b) the second distribution. If the center of the magnetic distribution is not identified, the feature values for each position may be calculated by changing a position of a point assumed to be the center in the vehicle width direction, and the highest feature value may be adopted. In this case, it is less necessary to specify the center of the magnetic distribution when calculating the feature value representing the symmetry of the magnetic distribution.

In this embodiment, the second distribution exemplarily described in FIG. 10 is generated by reversing the positive or negative sign of each value on the right side of the zero-cross X2 of the magnetic distribution in the vehicle width direction (first distribution). Alternatively, the second distribution may be generated by reversing the positive or negative sign of each value on the left side of the first distribution. As described above, the second total sum is the magnitude (absolute value) of the total value of each value of the second distribution. Therefore, the second total sum does not fluctuate depending on whether the positive or negative sign of each value on the right side of the first distribution is reversed or the positive or negative sign of each value on the left side of the first distribution is reversed.

Figure 13:
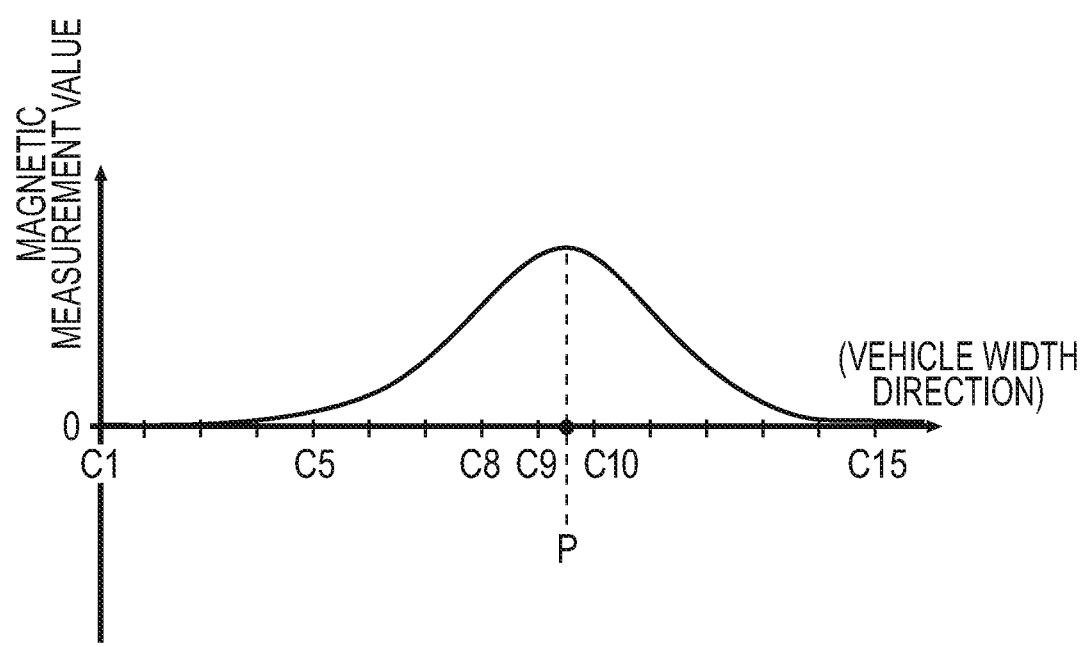
FIG. 13 is a descriptive diagram exemplarily depicting other distribution curve of the magnetic measurement value in the vehicle width direction by magnetic sensors at the time of passage over the magnetic marker.

For example, when a sensor unit in which magnetic sensors Cn having sensitivity in a vertical direction are arranged in the vehicle width direction is adopted, as exemplarily described in FIG. 13, a line-symmetric magnetic distribution similar to a normal distribution is obtained, in which the magnetic measurement value reaches a maximum value at the position straight above the magnetic marker and gradually decreases as it moves away in the vehicle width direction, from this position straight above the magnetic marker. As for a line-symmetrical magnetic distribution having a normal distribution without zero-cross appearing, as in this figure, a peak point P that is the position of the maximum value may be treated as the center of the magnetic distribution. Alternatively, similar as described above, the feature value may be calculated for each position while changing the position of the point assumed as the center of the magnetic distribution in the vehicle width direction, and the highest feature value may be adopted.

In the line-symmetric magnetic distribution exemplarily described in FIG. 13 and the point-symmetric magnetic distribution exemplarily described in FIG. 5, the magnitude relation between the first total sum and the second total sum is reversed. Regarding the point-symmetric magnetic distribution, as exemplarily described in FIG. 10, the first total sum becomes close to zero and the second total sum is increased. On the other hand, regarding the line-symmetric magnetic distribution in FIG. 13, the first total sum is increased while the second total sum becomes close to zero, as described below.

As in FIG. 14, in (a) the magnetic distribution in the vehicle width direction (first distribution), the values on both sides of the peak point P are positive. Therefore, the first total sum that is the magnitude (absolute value) of the total value of each value of (a) the magnetic distribution in the vehicle width direction (first distribution) is increased. On the other hand, in (b) the second distribution in which the positive and negative signs of each value on the right side of the peak point P are reversed, the positive and negative signs of waveforms on both left and right sides are reversed. Since the positive value on the left side is canceled by the negative value on the right side, (b) the second total sum, which is the magnitude (absolute value) of the total value of each value of the second distribution, becomes close to zero. This second total sum becomes close to zero as (a) the magnetic distribution in the vehicle width direction (first distribution) is more of the line symmetric across the peak point P, and when the both sides of the peak point P are of an ideally line symmetric, the second total sum will be zero. Therefore, with respect to the line-symmetric magnetic distribution as depicted in FIG. 13, the feature value, which is the magnitude (absolute value) of the differential value between (a) the first total sum of the magnetic distribution in the vehicle width direction and (b) the second total sum of the second distribution, also increases as the line-symmetric symmetry increases.

Note that when calculating the feature value as in FIG. 10 and FIG. 11, the feature value may be normalized based on the maximum value of the magnetic distribution, the larger value between the first and the second total sums, or the like. By normalization, the influence of the magnitude of distribution values of the magnetic distribution can be suppressed, and the feature value that accurately reflects the symmetry of the magnetic distribution can be generated.

In the case of a point-symmetric magnetic distribution that generates the zero-cross X2 as in FIG. 10, (a) the first total sum that is the magnitude (absolute value) of the total value of each value of the first distribution can be treated as the feature value of the symmetry. In this case, the higher the symmetry is, the closer to zero the first total sum as the feature value becomes. The feature value representing the symmetry in this way is not limited to this embodiment and can be changed as appropriate.

Note that when the vehicle passes over the magnetic marker, if an offset amount of the magnetic marker in the vehicle width direction is large, the position of the zero-cross X2 deviates toward an edge in a range of the magnetic sensors C1 to C15, which is a detection area of the sensor unit 11 (see FIG. 5). When the position of the zero-cross X2 is deviated, there is a possibility that the base portion on one side of the magnetic distribution (for example, the first distribution in FIG. 10($a$)) that is point-symmetric with reference to the zero-cross X2 will be out of the range of the magnetic sensors C1 to C15. In this case, the distribution on both sides with reference to the zero-cross X2 becomes unbalanced, and a problem may occur when the calculation method for the feature value as in FIG. 10 is performed. The above-mentioned first total sum that is expected to be close to zero in the point-symmetric magnetic distribution becomes large due to an unbalance in the distribution on both sides as described above, and there is a possibility that accuracy of the feature value is impaired. As countermeasures against such possibility, the following countermeasures can be considered for example.

A countermeasure in which the detection process is not executed when the offset amount of the magnetic marker in the vehicle width direction exceeds the threshold value.

A countermeasure in which the feature value is calculated by estimating the distribution on an assumption that magnetic measurement values smoothly attenuate regarding the base portion of the magnetic distribution that is out of the range of the magnetic sensors C1 to C15.

A countermeasure in which the size of the sensor unit 11 in the vehicle width direction is ensured as wide as possible to reduce the possibility that the magnetic distribution deviates from the range of the magnetic sensors C1 to C15.

A countermeasure in which, when the base portion on one side of the magnetic distribution deviates from the range of the magnetic sensors C1 to C15 with reference to the zero-cross X2, the base portion on the other side of the magnetic distribution is eliminated from a target of calculation to cause the zero-cross X2 to position at the center of the distribution which is the target of feature value calculation. For example, when the zero-cross X2 is positioned between the magnetic sensors C12 and C13, it is preferable to have the magnetic distribution in the range of (C10 to C15) that is the range of three magnetic sensors (C13 to C15) and the range of three magnetic sensors (C12 to C10) combined, to be the target of feature value calculation.

In this embodiment, the magnetic sensor Cn having sensitivity in the forwarding direction and the vehicle width direction of the vehicle is adopted. Instead of this, a magnetic sensor having sensitivity in one axial direction of the vertical direction, the forwarding direction, or the vehicle width direction may be adopted, two axial directions of the vehicle width direction and the vertical direction, or two axial directions of the forwarding direction and the vertical direction may be adopted, or the magnetic sensor having sensitivity in three axial directions of the vehicle width direction, the forwarding direction, and the vertical direction may be adopted.

In this embodiment, the columnar magnetic marker 10 having the diameter of 20 mm and the height of 28 mm is exemplarily described, however, for example, a sheet-shaped magnetic marker having a thickness of 1 to 5 mm and the diameter of about 80 to 120 mm may be adopted. As the magnet of this magnetic marker, for example, a ferrite rubber magnet or the like that is similar to a magnet sheet used for office work, in a kitchen, or the like may be adopted.

In the foregoing, while specific examples of the present invention have been described in detail as in the embodiments, these specific examples each merely disclose an example of technology included in the scope of claims for patent. Needless to say, the scope of claims for patent should not be interpreted in a limited manner by the configuration, numerical values, or the like in the specific examples. The scope of claims for patent includes techniques where the above-mentioned specific examples are modified, changed, or appropriately combined in various ways using publicly known technology and knowledge of those skilled in the art, and so forth.

REFERENCE SIGNS LIST 1 vehicular system
10 magnetic marker
100 lane
11 sensor unit
110 data generation circuit
12 detection unit (determination unit)
41 control unit
42 forward detection unit
5 vehicle
Cn magnetic sensor (n is an integer from 1 to 15)

The invention claimed is:

1. A marker detection method for detecting a magnetic marker laid in a road by using a magnetic sensor mounted to a vehicle, comprising:
calculating, using processing circuitry, as a feature value representing symmetry of a magnetic distribution which is a positional distribution in a certain direction with respect to the vehicle of magnetic measurement values measured by the magnetic sensor, a difference between (1) a first total sum indicating a magnitude of a total value that sums each magnetic measurement value in the magnetic distribution in the certain direction measured by the magnetic sensor and (2) a second total sum indicating a magnitude of a total value that sums (2-a) each first magnetic measurement value in the magnetic distribution in the certain direction measured by the magnetic sensor, the first magnetic measurement value belonging to one side of the magnetic distribution with respect to a center of the magnetic distribution, with positive and negative signs of the first magnetic measurement value reversed and (2-b) each second magnetic measurement value in the magnetic distribution in the certain direction measured by the magnetic sensor, the second magnetic measurement value belonging to another side of the magnetic distribution with respect to the center of the magnetic distribution; and
determining, using the processing circuitry, a possibility of a presence of a magnetic generation source other than the magnetic marker, that causes disturbance by processing the feature value, wherein
the center of the magnetic distribution is either a point at which the magnetic measurement value crosses zero, or a point at which the magnetic measurement value has a peak value, and
only the positive and negative signs of the first magnetic measurement value are reversed, and positive and negative signs of the second magnetic measurement value are not reversed, wherein the method further comprises: performing, using the processing circuitry, control for assisting driving of the vehicle, and, switching, using the processing circuitry, control contents including whether or not to perform the control for assisting driving in accordance with the possibility of the presence of the magnetic generation source.

2. The marker detection method according to claim 1, further comprising:
calculating the first total sum and the second total sum.

3. The marker detection method according to claim 1, wherein the magnetic distribution is a distribution in a forwarding direction of the vehicle.

4. The marker detection method according to claim 1, wherein the magnetic distribution is a distribution in a width direction of the vehicle.

5. The marker detection method according to claim 1, wherein the presence or absence of magnetic generation source is determined by a threshold process regarding the feature value.

6. The marker detection method according to claim 1, wherein the feature value is a value normalized by a maximum value of the magnetic distribution.

7. The marker detection method according to claim 2, wherein the presence or absence of magnetic generation source is determined by a threshold process regarding the feature value.

8. The marker detection method according to claim 3, wherein the presence or absence of magnetic generation source is determined by a threshold process regarding the feature value.

9. The marker detection method according to claim 4, wherein the presence or absence of magnetic generation source is determined by a threshold process regarding the feature value.

10. The marker detection method according to claim 1, wherein
the magnetic measurement value obtained by the magnetic sensor is reversed between positive and negative before and after the magnetic sensor passes straight above the magnetic marker, and
the center of the magnetic distribution is the point at which the magnetic measurement value crosses zero.

11. The marker detection method according to claim 1, wherein
the magnetic measurement value obtained by the magnetic sensor becomes the peak value when the magnetic sensor is straight above the magnetic marker, and
the center of the magnetic distribution is the point at which the magnetic measurement value has the peak value.

12. A vehicular system, comprising:
the magnetic sensor which detects magnetism of the magnetic marker; and
the processing circuitry configured to determine a presence or absence of the magnetic generation source that causes the disturbance, wherein
the possibility of the presence of the magnetic generation source is determined by performing the marker detection method according to claim 1.

13. A marker detection method for detecting a magnetic marker laid in a road by using a magnetic sensor mounted to a vehicle, comprising:
acquiring, using the magnetic sensor, a magnetic distribution in which positive and negative signs of magnetic measurement values measured by the magnetic sensor are reversed at a position straight above the magnetic marker;
calculating, using the processing circuitry, as a feature value representing symmetry of a magnetic distribution indicating a positional distribution in a certain direction with respect to the vehicle of the magnetic measurement values measured by the magnetic sensor, a magnitude of a total value that sums each magnetic measurement value in the magnetic distribution in the certain direction measured by the magnetic sensor; and
determining, using the processing circuitry, a possibility of the presence of a magnetic generation source other than the magnetic marker, that causes disturbance by processing the feature value, wherein the method further comprises: performing, using the processing circuitry, control for assisting driving of the vehicle, and, switching, using the processing circuitry, control contents including whether or not to perform the control for assisting driving in accordance with the possibility of the presence of the magnetic generation source.

14. The marker detection method according to claim 13, wherein the magnetic distribution is a distribution in a forwarding direction of the vehicle.

15. The marker detection method according to claim 13, wherein the magnetic distribution is a distribution in a width direction of the vehicle.

16. The marker detection method according to claim 13, wherein the presence or absence of magnetic generation source is determined by a threshold process regarding the feature value.

17. The marker detection method according to claim 14, wherein the presence or absence of magnetic generation source is determined by a threshold process regarding the feature value.

18. The marker detection method according to claim 15, wherein the presence or absence of magnetic generation source is determined by a threshold process regarding the feature value.

19. The marker detection method according to claim 13, wherein the feature value is a value normalized by a maximum value of the magnetic distribution.

20. A vehicular system, comprising:
the magnetic sensor which detects magnetism of the magnetic marker; and
the processing circuitry configured to determine a presence or absence of the magnetic generation source that causes the disturbance, wherein
the possibility of the presence of the magnetic generation source is determined by performing the marker detection method according to claim 13.

* * * * *